US006845348B1

United States Patent
Subbarao et al.

(10) Patent No.: US 6,845,348 B1
(45) Date of Patent: Jan. 18, 2005

(54) DRIVER WAVEFORM MODELING WITH MULTIPLE EFFECTIVE CAPACITANCES

(75) Inventors: Prasad Subbarao, San Jose, CA (US); Sandeep Bhutani, Towson, MD (US); Charutosh Dixit, Sunnyvale, CA (US); Prabhakaran Krishnamurthy, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 757 days.

(21) Appl. No.: 09/814,417

(22) Filed: Mar. 21, 2001

Related U.S. Application Data

(60) Provisional application No. 60/194,073, filed on Apr. 3, 2000.

(51) Int. Cl.$^7$ ............................ G06F 17/10; G06F 15/60
(52) U.S. Cl. ............................ 703/2; 703/14; 327/170; 716/1
(58) Field of Search .................... 716/1; 327/112, 327/170, 206; 326/88; 703/2, 14

(56) References Cited

U.S. PATENT DOCUMENTS

| | | | | |
|---|---|---|---|---|
| 4,276,487 A | * | 6/1981 | Arzubi et al. | 326/88 |
| 5,379,231 A | * | 1/1995 | Pillage et al. | 703/14 |
| 5,859,552 A | * | 1/1999 | Do et al. | 327/170 |
| 6,111,443 A | * | 8/2000 | Mores et al. | 327/206 |
| 6,359,478 B1 | * | 3/2002 | Chow | 327/112 |
| 6,732,065 B1 | * | 5/2004 | Muddu | 703/2 |

OTHER PUBLICATIONS

Jang et al., B.S. A Prediction Algorithm for Feedback Control Models with Long Delays, 2nd IEEE International Workshop on Broadband Switching Systems, Dec. 1997, pp. 131–136.*
Sheehan, B.N. Osculating Thevenin Model for Predicting Delay and Slew of Capacity Characterized Cells, Design Automation Conference, IEEE, Jun. 2002, pp. 866–869.*
Director et al., S. Computational Efficiency in the Determination of Thevenin and Norton Equivalents, IEEE Transactions on Circuits and Systems, vol. 19, No. 1, Jan. 1972, pp. 96–98.*
Florentin Dartu et al.; "Performance Computation for Pre-characterized CMOS Gates with RC Loads"; IEEE Transactions on Computer–Aided Design of Integrated Circuits and Systems, vol. 15, No. 5, May 1996; pp. 544–553.

* cited by examiner

Primary Examiner—Russell Frejd
(74) Attorney, Agent, or Firm—Fitch, Even, Tabin & Flannery

(57) ABSTRACT

A method for modeling the output waveform of a cell driving a resistance-capacitance network includes multiple effective capacitances. A method of calculating Thevenin parameters includes the steps of (a) initializing estimates of effective capacitances Ceff1 and Ceff2, of a switching threshold delay t0, and of a slope delay deltat; (b) solving ramp response equations for t0 and deltat as a function of Ceff1 and Ceff2; (c) comparing the estimates of t0 and deltat with solutions for t0 and deltat found in step (b); and (d) replacing the estimates of t0 and deltat with the solutions for t0 and deltat if the solutions for t0 and deltat have not converged to the estimates of t0 and deltat.

12 Claims, 3 Drawing Sheets

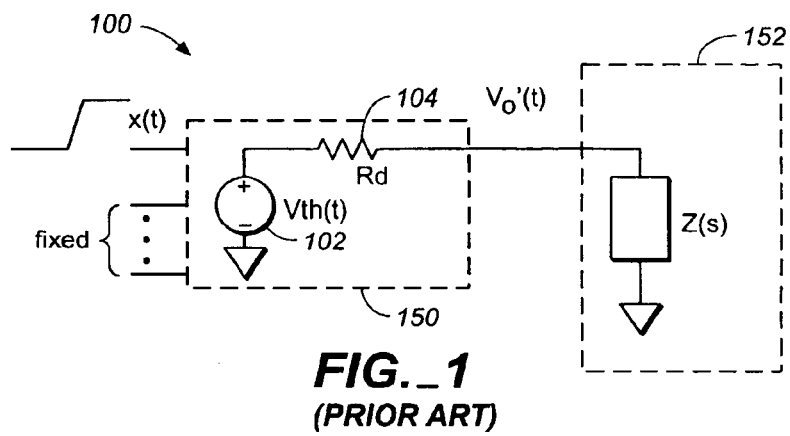
FIG._1
*(PRIOR ART)*
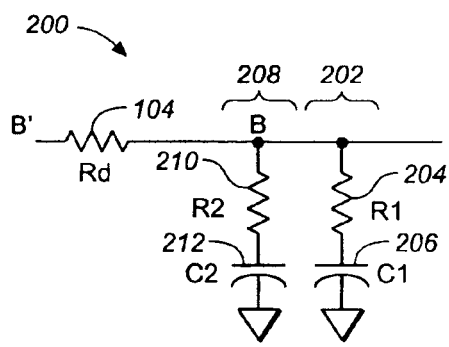
FIG._2
*(PRIOR ART)*
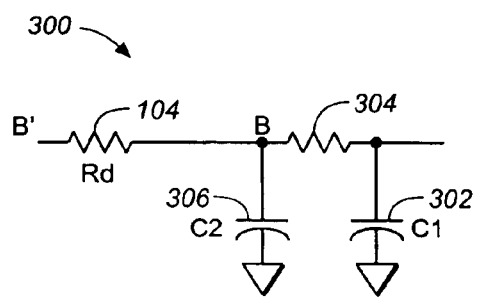
FIG._3
*(PRIOR ART)*

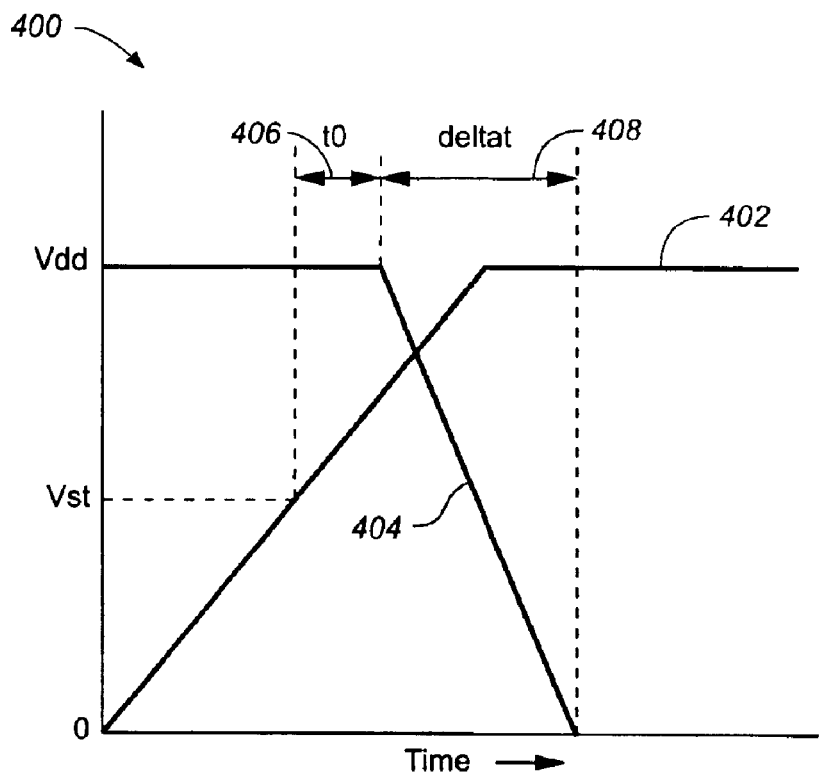
FIG._4
*(PRIOR ART)*
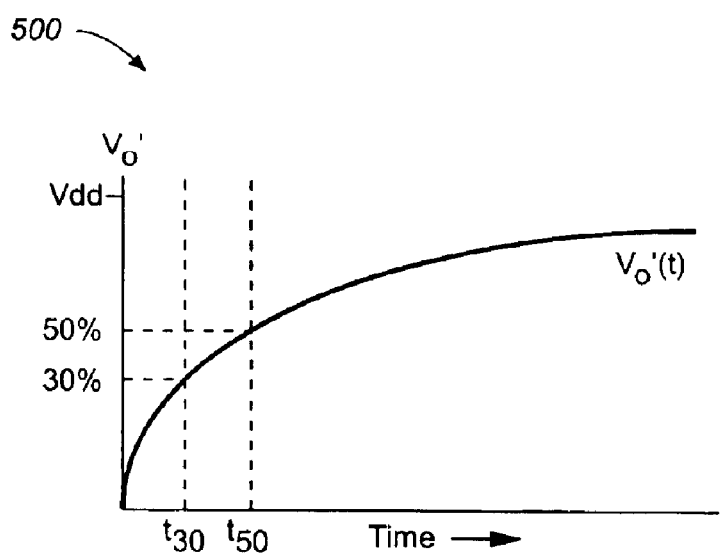
FIG._5

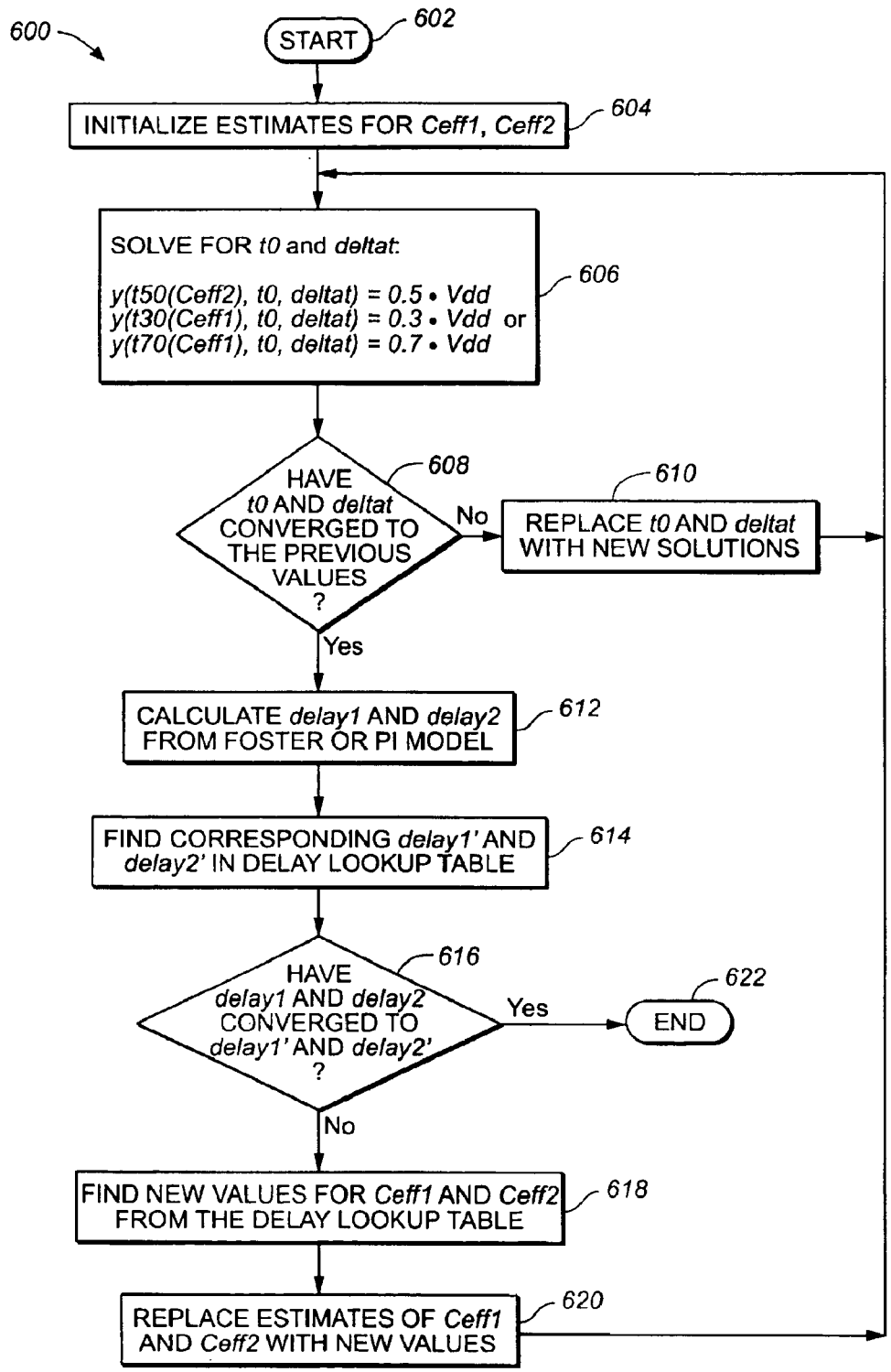
*FIG._6*

US 6,845,348 B1

DRIVER WAVEFORM MODELING WITH MULTIPLE EFFECTIVE CAPACITANCES

CROSS-REFERENCE TO RELATED APPLICATIONS

This application claims the benefit of U.S. Provisional Application No. 60/194,073, filed on Apr. 3, 2000.

BACKGROUND OF THE INVENTION

The present invention relates generally to electronic circuit design using computer simulation techniques. More specifically, but without limitation thereto, the present invention relates to modeling the output waveform of a circuit element driving a distributed resistance-capacitance network.

Methods for modeling the output waveform of a circuit element or cell driving a resistance-capacitance network generally use a Thevenin equivalent model, i.e., a voltage source in series with a resistance, and a load having a single effective capacitance. However, previous methods produced unsatisfactory results using a computer circuit simulation program such as SPICE because the actual waveform delays were found to be more than ten percent larger than those predicted by the simulation program. A method is therefore needed for modeling the output waveform of a cell driving a resistance-capacitance network that compares more closely to the actual output waveform.

SUMMARY OF THE INVENTION

The present invention advantageously addresses the needs above as well as other needs by providing a method for modeling the output waveform of a cell driving a resistance-capacitance network that includes multiple effective capacitances.

In one embodiment, the invention may be characterized as a method of calculating Thevenin parameters that includes the steps of (a) initializing estimates of effective capacitances Ceff1 and Ceff2, of a switching threshold delay t0, and of a slope delay deltat; (b) solving ramp response equations for t0 and deltat as a function of Ceff1 and Ceff2; (c) comparing the estimates of t0 and deltat with solutions for t0 and deltat found in step (b); and (d) replacing the estimates of to and deltat with the solutions for t0 and deltat if the solutions for t0 and deltat have not converged to the estimates of t0 and deltat.

In another embodiment, the invention may be characterized as a computer program product that includes a medium for embodying a computer program for input to a computer and a computer program embodied in the medium for causing the computer to perform at least one of the following functions:

(a) initializing estimates of effective capacitances Ceff1 and Ceff2, of a switching threshold delay t0, and of a slope delay deltat;

(b) solving ramp response equations for t0 and deltat as a function of Ceff1 and Ceff2;

(c) comparing the estimates of t0 and deltat with solutions for t0 and deltat found in step (b);

(d) replacing the estimates of t0 and deltat with the solutions for t0 and deltat if the solutions for t0 and deltat have not converged to the estimates of t0 and deltat;

(e) repeating steps (b), (c), and (d) until the solutions for t0 and deltat converge to the estimates of t0 and deltat;

(f) calculating a delay1 as a function of t30(Ceff1) or t70(Ceff1) and a delay2 as a function of t50(Ceff2) from a Foster or a pi model;

(g) comparing delay1 and delay2 to delays delay1' and delay2' corresponding to Ceff1 and Ceff2 in a delay lookup table;

(h) finding new values for Ceff1 and Ceff2 from a reverse lookup of delay1 and delay2 in the delay lookup table if the calculated values for delay1 and delay2 have not converged to delays delay1' and delay2';

(i) replacing the estimates of Ceff1 and Ceff2 in step (b) with the new values for Ceff1 and Ceff2; and (j) repeating steps (b) through (i) until the calculated values for delay1 and delay2 converge to delays delay1' and delay2'.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein:

FIG. 1 is a schematic diagram of a Thevenin equivalent model of the prior art;

FIG. 2 is a schematic diagram of a Foster load synthesis model of the prior art for modeling the voltage response of the CMOS gate of FIG. 1;

FIG. 3 is a schematic diagram of a pi load synthesis model of the prior art for modeling the voltage response of the CMOS gate of FIG. 1;

FIG. 4 is an ideal voltage plot of the prior art illustrating Thevenin voltage parameter definitions for the CMOS gate of FIG. 1;

FIG. 5 is a voltage plot illustrating typical output voltage response of the CMOS gate of FIG. 1 as a function of time; and FIG. 6 is a flowchart of an embodiment of the present invention for calculating Thevenin parameters and the effective capacitances Ceff1 and Ceff2.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a schematic diagram of a Thevenin equivalent model 100 of the prior art. Shown are a Thevenin voltage source 102, a driver resistance 104, a CMOS gate 150 and a load impedance 152. The CMOS gate 150 includes the Thevenin voltage source 102, which is connected in series with the driver resistance 104. The Thevenin equivalent model 100 is used to model a typical cell in integrated circuit designs.

FIG. 2 is a schematic diagram of a Foster load synthesis model 200 of the prior art for modeling the voltage response of the CMOS gate 150 of FIG. 1. Shown are a driver resistance 104, a first current branch 202, a first resistor 204, a first capacitor 206, a second current branch 208, a second resistor 210, and a second capacitor 212. The Foster load synthesis model 200 is connected in series with the driver resistance 104 of the CMOS gate 150 and includes multiple current branches 202 and 208 connected in parallel. In the first current branch 202, the first resistor 204 is connected in series with the first capacitor 206. Likewise in the second current branch 208, the second resistor 210 is connected in series with the second capacitor 212.

FIG. 3 is a schematic diagram of a pi load synthesis model 300 of the prior art for modeling the voltage response of the CMOS gate 150 of FIG. 1. Shown are a driver resistance 104, a first capacitor 302, a first resistor 304, and a second capacitor 306. The pi load synthesis model 300 is connected in series with the driver resistance 104 of the CMOS gate 150. The first capacitor 302 is connected between the driver resistance 104 and ground. The first resistor 304 and the second capacitor 306 are connected in series across the first capacitor 302.

FIG. 4 is an ideal voltage plot vs. time 400 illustrating Thevenin voltage parameter definitions for an inverting CMOS gate. Shown are a gate input signal 402, a Thevenin voltage 404, a switching threshold delay (t0) 406, and a slope delay (deltat) 408. The delay between the time when the gate input signal 402 reaches the logic switching threshold Vst and the time when the Thevenin voltage 404 begins to fall defines the switching threshold delay (t0) 406. The delay between the time when the Thevenin voltage 404 begins to fall and the time when the Thevenin voltage 404 reaches zero defines the slope delay (deltat) 408. Similar Thevenin voltage parameters may be defined for other CMOS gates and input transitions.

Using the Thevenin model, the output voltage Vo' of the CMOS gate 150 may be expressed as a function of time t by $$Vo'(t) = y(t, t0, deltat) \quad (1)$$

Specifically, for a falling output transition $$y(t, t0, deltat) = Vdd \quad t - t0 < 0 \quad (2)$$
$$y(t, t0, deltat) = Vdd - y0(t, t0, deltat) \quad 0 \leq t - t0 < deltat$$
$$y(t, t0, deltat) = Vdd - y0(t, t0, deltat) + y0(t - deltat, t0, deltat) \quad t - t0 \geq deltat$$

and for a rising output transition $$y(t, t0, deltat) = 0 \quad t - t0 < 0 \quad (3)$$
$$y(t, t0, deltat) = y0(t, t0, deltat) \quad 0 \leq t - t0 < deltat$$
$$y(t, t0, deltat) = y0(t, t0, deltat) - y0(t - deltat, t0, deltat) \quad t - t0 \geq deltat$$

where y0(u,v,w) is the single positive ramp response for a capacitive load C and a driver resistance Rd, which may be found from the equation $$y0(u, v, w) = Vdd \cdot \left[ \frac{u-v}{w} - \left( \frac{Rd \cdot C}{w} \left(1 - e^{-\frac{u-v}{Rd \cdot C}}\right) \right) \right] \quad (4)$$

Equations (1), (2), (3), and (4) are derived and explained in detail in the article "Performance Computation for Precharacterized CMOS Gates with RC Loads", Florentin Dartu, Noel Menezes, and Lawrence T. Pileggi, *IEEE Transactions on Computer-aided Design of Integrated Circuits and Systems*, Vol. 15, No. 5, May 1996.

FIG. 5 is a voltage plot 500 illustrating typical output voltage response Vo'(t) of the CMOS gate 150 of FIG. 1 as a function of time. As the effective capacitance of the load 152 builds up charge, the output voltage Vo'(t) increases from zero to 30 percent of the final voltage for a rising transition in a time t30 from the input switching threshold and continues increasing to 50 percent of the final voltage in a time t50 measured from the input switching threshold. For a falling transition, the output voltage Vo' drops to 70 percent of the initial voltage in a time t70 from the input switching threshold.

In contrast to methods that solve for the Thevenin parameters using a single effective capacitance, the following method uses two values of effective capacitance Ceff1 and Ceff2. Ceff1 is used to find either t30(Ceff1) (for a rising transition) or t70(Ceff1) (for a falling transition), and Ceff2 is used to find t50(Ceff2) to calculate the Thevenin parameters from the ramp response equations $$y(t50(Ceff2), t0, deltat) = 0.5 \cdot Vdd \quad (5)$$
$$y(t30(Ceff1), t0, deltat) = 0.3 \cdot Vdd \text{ (or}$$
$$y(t70(Ceff1), t0, deltat) = 0.7 \cdot Vdd)$$

Initial estimates are made for Ceff1, Ceff2, t0, and deltat, for example:

$$Ceff1 = Ceff2 = 0.0001 \text{ pf} \quad (6)$$
$$deltat = 5 \cdot t50(Ceff2) - t30(Ceff1)$$
$$t0 = t50(Ceff2) - 0.69 \cdot Rd \cdot Ceff2 - 0.5 \cdot deltat$$

Newton's method may be used to solve the non-linear equations (5) from equations (1)–(4) for t0 and deltat by using the estimates of Ceff1 and Ceff2 and a delay lookup table according to well known techniques. The delay lookup table contains a range of delays calculated as a function of input ramptime and input capacitance and is contained in a precharacterized cell library created according to well known techniques. The calculated solutions for t0 and deltat are substituted for the previous estimates of t0 and deltat in the ramp response equations (5) until the solutions for t0 and deltat converge to a desired accuracy.

After computing the Thevenin parameters t0 and deltat from the initial estimates, either the Foster model 200 of FIG. 2 or the pi model 300 of FIG. 3 may be used according to well known techniques such as AWE (asymptotic waveform evaluation) to calculate a first delay, delay1, to t30 (Ceff1) or t70(Ceff1) and a second delay, delay2, to t50 (Ceff2).

The calculated values for delay1 and delay2 are compared to corresponding delays delay1' and delay2' found in the lookup table using the input ramptime and Ceff1 and Ceff2, respectively. If delay1 and delay2 have converged to within a desired accuracy of delay1' and delay2', then the calculation of the Thevenin parameters t0 and deltat is complete. If not, then new values for Ceff1 and Ceff2 are found by a reverse interpolation of delay1 and delay2 from the delay lookup table, i.e., $$delay = f(\text{input ramptime, capacitance}) => \quad (7)$$
$$capacitance = g(\text{input ramptime, delay})$$

After obtaining new values for Ceff1 and Ceff2, the Thevenin parameters t0 and deltat are recomputed from the ramp response equations (5), and new values for delay1 and delay2 are calculated from the Foster or the pi model until delay1 and delay2 converge to delay1' and delay2' within a desired accuracy, for example, 1 picosecond.

FIG. 6 is a flowchart 600 for calculating the Thevenin parameters of switching threshold delay t0 and slope delay deltat and effective load capacitances Ceff1 and Ceff2 according to the method explained above.

Step 602 is the entry point for the flowchart 600.

In step 604, estimates for Ceff1, Ceff2, t0, and deltat are initialized.

In step 606, the solutions to the following ramp response equations are calculated:

$$y(t50(Ceff2), t0, deltat)=0.5 \cdot Vdd \text{ and either}$$

$$y(t30(Ceff1), t0, deltat)=0.3 \cdot Vdd \text{ or}$$

$$y(t70(Ceff1), t0, deltat)=0.7 \cdot Vdd \text{ for t0 and deltat.}$$

In step 608, the estimates of t0 and deltat are compared with the calculated solutions. If the calculated solutions for t0 and deltat have not yet converged to the estimates, then control transfers to step 610. Otherwise, control transfers to step 612.

In step 610, the estimates of t0 and deltat are replaced with the calculated solutions, and control transfers to step 606.

In step 612, if the solutions for t0 and deltat have converged to the estimates, then the delay1 is calculated as a function of t30(Ceff1) or t70(Ceff1) and delay2 is calculated as a function of t50(Ceff2) from a Foster or a pi model.

In step 614, corresponding delays delay1' and delay2' for Ceff1 and Ceff2 are found in the delay lookup table.

In step 616, the calculated values for delay1 and delay2 are compared to the corresponding delays delay1' and delay2'. If delay1 and delay2 have converged to within a desired accuracy of delay1' and delay2', then control transfers to step 622.

If delay1 and delay2 have not converged to within a desired accuracy of delay1'and delay2', then new values for Ceff1 and Ceff2 are found from the delay lookup table in step 618.

In step 620, the estimates of Ceff1 and Ceff2 are replaced with the new values and step 606 is repeated.

Step 622 is the exit point for the flow chart 600.

The flowchart 600 may also be embodied in a computer program product that includes a medium for embodying a computer program for input to a computer and a computer program embodied in the medium for causing the computer to perform at least one of the following functions:

(a) initializing estimates of effective capacitances Ceff1 and Ceff2, of a switching threshold delay t0, and of a slope delay deltat;

(b) solving ramp response equation for t0 and deltat as a function of Ceff1 and Ceff2;

(c) comparing the estimates of t0 and deltat with solutions for t0 and deltat found in step (b);

(d) replacing the estimates of t0 and deltat with the solutions for t0 and deltat if the solutions for t0 and deltat have not converged to the estimates of t0 and deltat;

(e) repeating steps (b), (c), and (d) until the solutions for t0 and deltat converge to the estimates of t0 and deltat;

(f) calculating a delay1 as a function of t30(Ceff1) or t70(Ceff1) and a delay2 as a function of t50(Ceff2) from a Foster or a pi model;

(g) comparing delay2 and delay2 to delays delay1' and delay2' corresponding to Ceff1 and Ceff2 in a delay lookup table;

(h) finding new values for Ceff1 and Ceff2 from a reverse lookup of delay1 and delay2 in the delay lookup table if the calculated values for delay1 and delay2 have not converged to delays delay1' and delay2';

(i) replacing the estimates of Ceff1 and Ceff2 in step (b) with the new values for Ceff1 and Ceff2; and (j) repeating steps (b) through (i) until the calculated values for delay1 and delay2 converge to delays delay1' and delay2'.

Other modifications, variations, and arrangements of the present invention may be made in accordance with the above teachings other than as specifically described to practice the invention within the spirit and scope defined by the following claims.

What is claimed is:

1. A method of calculating a switching threshold delay and a slope delay for a gate input signal of a cell comprising steps of:

(a) initializing estimates of a first effective capacitance Ceff1, of a second effective capacitance Ceff2, of a switching threshold delay to, and of a slope delay deltat for a gate input signal of a cell;

(b) solving ramp response equations for a capacitive load and a driver resistance to calculate solutions for t0 and deltat as a function of the first effective capacitance Ceff1 for a rising or falling transition voltage of the gate input signal and as a function of the second effective capacitance Ceff2 for fifty percent of a final transition voltage of the gate input signal;

(c) if the calculated solutions for t0 and deltat have converged to the estimates of t0 and deltat within a desired accuracy, then continuing from step (e), else continuing from step (d);

(d) replacing the estimates of t0 and deltat with the calculated solutions for t0 and deltat, respectively, and continuing from step (b); and (e) generating as output the calculated solutions for the switching threshold delay t0 and the slope delay deltat for the gate input signal of the cell.

2. The method of claim 1 further comprising the step of (f) calculating a solution for a first delay delay1 to the rising or falling transition voltage of the gate input signal as a function of the estimate of the first effective capacitance Ceff1 and a solution for a second delay delay2 to fifty percent of the final transition voltage of the gate input signal as a function of the estimate of the second effective capacitance Ceff2 from a Foster or a pi model.

3. The method of claim 2 further comprising the step of (g) comparing the delays delay1 and delay2 to delays delay1' and delay2' respectively, wherein the delays delay1' and delay2' are estimated from a function of input ramptime and capacitance corresponding to the estimates of the effective capacitances Ceff1 and Ceff2, respectively.

4. The method of claim 3 further comprising the step of (h) replacing the estimates of the effective capacitances Ceff1 and Ceff2 with new values from the function of input ramptime and capacitance if the delays delay1 and delay2 have not converged to the delays delay1' and delay2' within a desired accuracy.

5. The method of claim 4 further comprising the step of (i) repeating steps (b) through (h) until the delays delay1 and delay2 converge to the delays delay1' and delay2' within a desired accuracy.

6. The method of claim 5 further comprising the step of (j) generating as output the calculated solution for the first delay delay1 as a function of the estimate of the first effective capacitance Ceff1 and the calculated solution for the second delay delay2 as a function of the estimate of the second effective capacitance Ceff2.

7. A computer program product comprising:

a medium for embodying a computer program for input to a computer; and a computer program embodied in the medium for causing the computer to perform steps of (a) initializing estimates of a first effective capacitance Ceff1, of a second effective capacitance Ceff2, of a switching threshold delay t0, and of a slope delay deltat for a gate input signal of a cell;

(b) solving ramp response equations for a capacitive load and a driver resistance to calculate solutions for t0 and deltat as a function of the first effective capacitance Ceff1 for a rising or falling transition voltage of the rate input signal and as a function of the second effective capacitance Ceff2 for fifty percent of a final transition voltage of the gate input signal;

(c) if the calculated solutions for t0 and deltat have converged to the estimates of t0 and deltat within a desired accuracy, then continuing from step (e), else continuing from step (d);

(d) replacing the estimates of to and deltat with the calculated solutions for t0 and deltat, respectively, and continuing from step (b); and (e) generating as output the calculated solutions for the switching threshold delay t0 and the slope delay deltat for the gate input signal of the cell.

8. The computer program product of claim 7 further comprising the step of (f) calculating a solution for a first delay delay1 to the rising or falling transition voltage of the gate input signal as a function of the estimate of the first effective capacitance Ceff1 and a solution for a second delay delay2 to fifty percent of the final transition voltage of the gate input signal as a function of the estimate of the second effective capacitance Ceff2.

9. The computer program product of claim 8 further comprising the step of (g) comparing the delays delay1 and delay2 to delays delay1' and delay2' respectively, wherein delay1' and delay2' are calculated as a function of input ramptime and capacitance corresponding to the estimates of the effective capacitances Ceff1 and Ceff2.

10. The computer program product of claim 9 further comprising the step of (h) replacing the estimates of the effective capacitances Ceff1 and Ceff2 with new values from the function of input ramptime and capacitance if the delays delay1 and delay2 have not converged to the delays delay1' and delay2' within a desired accuracy.

11. The computer program product of claim 10 further comprising the step of (i) repeating steps (b) through (h) until the delays delay1 and delay2 converge to the delays delay1' and delay2' within a desired accuracy.

12. The computer program product of claim 11 further comprising the step of (j) generating as output the calculated solution for the first delay delay1 as a function of the estimate of the first effective capacitance Ceff1 and the calculated solution for the second delay delay2 as a function of the estimate of the second effective capacitance Ceff2.

* * * * *